United States Patent [19]

Kusakabe et al.

[11] 4,366,448
[45] Dec. 28, 1982

[54] POWER-AMPLIFYING CIRCUIT

[75] Inventors: Hiromi Kusakabe, Yokohama; Masahide Nagumo, Kawasaki, both of Japan

[73] Assignee: Tokyo Shibaura Denki Kabushiki Kaisha, Japan

[21] Appl. No.: 134,303

[22] Filed: Mar. 26, 1980

[30] Foreign Application Priority Data

Mar. 31, 1979 [JP] Japan .................................. 54-38616
Mar. 31, 1979 [JP] Japan .................................. 54-38631

[51] Int. Cl.³ .............................................. H03F 3/26
[52] U.S. Cl. .................................. 330/268; 330/255; 330/274
[58] Field of Search ............... 330/255, 258, 265, 268, 330/270, 274

[56] References Cited

U.S. PATENT DOCUMENTS

| 3,434,069 | 3/1969 | Jones | 330/259 |
| 4,041,407 | 8/1977 | Main | 330/268 |
| 4,072,907 | 2/1978 | Sekiya et al. | 330/261 |
| 4,077,012 | 2/1978 | Iwamatsu | 330/253 |
| 4,176,323 | 11/1979 | Odell | 330/268 |

FOREIGN PATENT DOCUMENTS

| 2711912 | 9/1977 | Fed. Rep. of Germany . |
| 1131217 | 10/1968 | United Kingdom . |
| 1440079 | 6/1976 | United Kingdom . |
| 1461808 | 1/1977 | United Kingdom . |
| 1467059 | 3/1977 | United Kingdom . |
| 1503238 | 3/1978 | United Kingdom . |

Primary Examiner—James B. Mullins
Assistant Examiner—Gene Wan
Attorney, Agent, or Firm—Finnegan, Henderson, Farabow, Garrett & Dunner

[57] ABSTRACT

A power-amplifying circuit embodying this invention includes a pre-amplifier stage which comprises two emitter-connected transitors, one of whose bases is supplied with an input signal and an output stage comprising complementary pair of a first transistor of a PNP type and an emitter-grounded second transistor of an NPN type which carry out a class-AB push-pull operation in accordance with the amplitude of a current from the pre-amplifier stage. The power-amplifier circuit of this invention further comprises third transistor for detecting an operating current of the first transistor of the output stage, a fourth transistor which is driven by the third transistor and whose base is connected to the base of the second transistor of the output stage, and fifth and sixth transistors which are connected in such a manner that a sum of the base-emitter voltages of the fifth and sixth transistors is made equal to a sum of the base-emitter voltages of the second and fourth transistors, and through which there flows a current corresponding to a product of the operating currents of the first and second transistors constituting the output stage. A current running through the fifth and sixth transistors is supplied to the pre-amplifier means through a negative feedback path so as to be regulated.

6 Claims, 9 Drawing Figures

FIG. 2
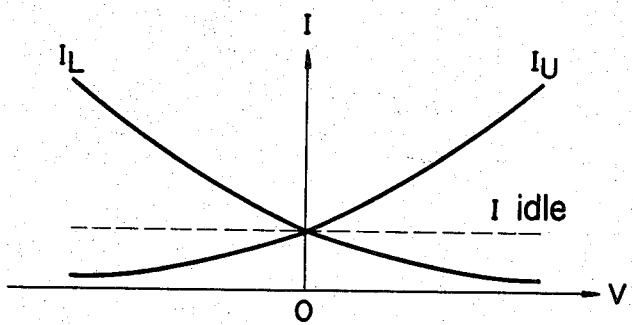
FIG. 4A
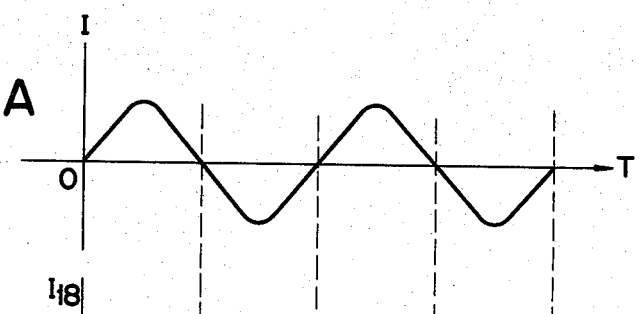
FIG. 4B
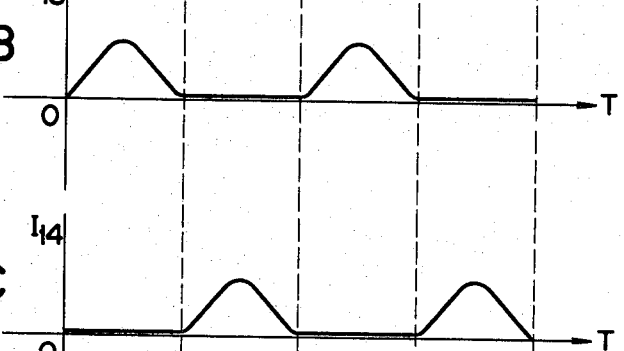
FIG. 4C
FIG. 4D
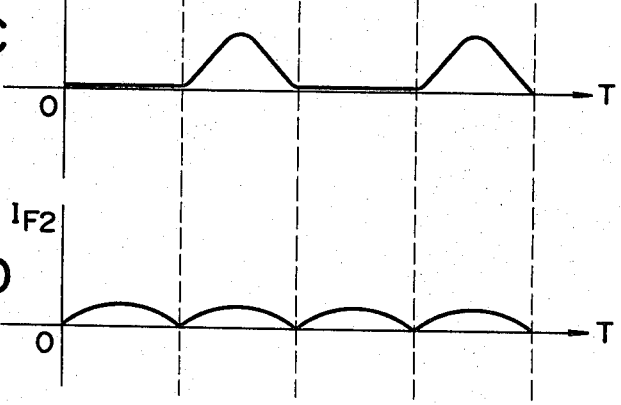

POWER-AMPLIFYING CIRCUIT

This invention relates to a power-amplifying circuit.

A power-amplifying circuit generally has transistors disposed in the output stage. In this case, the amplitude of an output from the transistor is defined by a base-emitter voltage $V_{BE}$ and collector-emitter saturated voltage $V_{CE}(SAT)$. Accordingly, in the case of a power-amplifying circuit driven by a low power source voltage, where a load resistance is constant, then the magnitude of an output power is proportionate to a square of the amplitude of an output from the transistor. Therefore, it is impossible to produce a sufficiently large power under the effect of the above-mentioned voltages $V_{BE}$, $V_{CE}(SAT)$. Hitherto, therefore, it has been attempted to resolve this problem by applying an output transformer or bootstrap circuit. However, the application of the transformer has the drawbacks that a power-amplifying circuit becomes more expensive, as a whole occupies an area increased by the application, and distortions arise in output charactransformer. The application of the bootstrap circuit requires a large capacity capacitor and also results in the higher cost of a power-amplifying circuit and the increased area thereof. The application of the bootstrap circuit has further disadvantage that in the case of a low power source voltage of about 1.5 volts, it is difficult to apply a direct current bias to the bootstrap circuit.

With a power-amplifying circuit carrying out a class-AB operation, it is necessary to define the quiescent current of an output transistor in order to eliminate crossover distortions. However, the power-amplifying circuit driven by a low power source voltage presents difficulties in defining the quiescent current. Particularly where the output stage of the power-amplifying circuit is formed of a complementary pair of an NPN transistor and an emitter-grounded PNP transistor, no effective method of defining the quiescent current has been devised to date.

It is accordingly the object of this invention to provide a power-amplifying circuit which can define the quiescent current of an output transistor by simple arrangement and also can be operated under a fully stable condition by effectively utilizing a power source voltage, even if it is low.

To this end, the present invention provides a power-amplifying circuit which comprises pre-amplifier means, an output means provided with first and second transistors in a push-pull arrangement which are driven by an output from the pre-amplifier means, an operation means provided with third and fourth transistors whose bases are respectively connected to the bases of the first and second transistors for supplying a signal corresponding to the product of operating currents of the first and second transistors to the pre-amplifier means for stabilization.

This invention can be more fully understood from the following detailed description when taken in conjunction with the accompanying drawings, in which:

FIG. 1 shows the arrangement of a power-amplifying circuit according to a first embodiment of this invention;

FIG. 2 indicates the characteristics of an output from the power-amplifying circuit of FIG. 1;

FIG. 3 sets forth the arrangement of a power-amplifying circuit according to a second embodiment of the invention;

FIGS. 4A to 4D are the diagrams of the waveforms of signals generated in the various sections of the power-amplifying circuit of FIG. 3, by way of illustrating the operation thereof;

Figure 1:
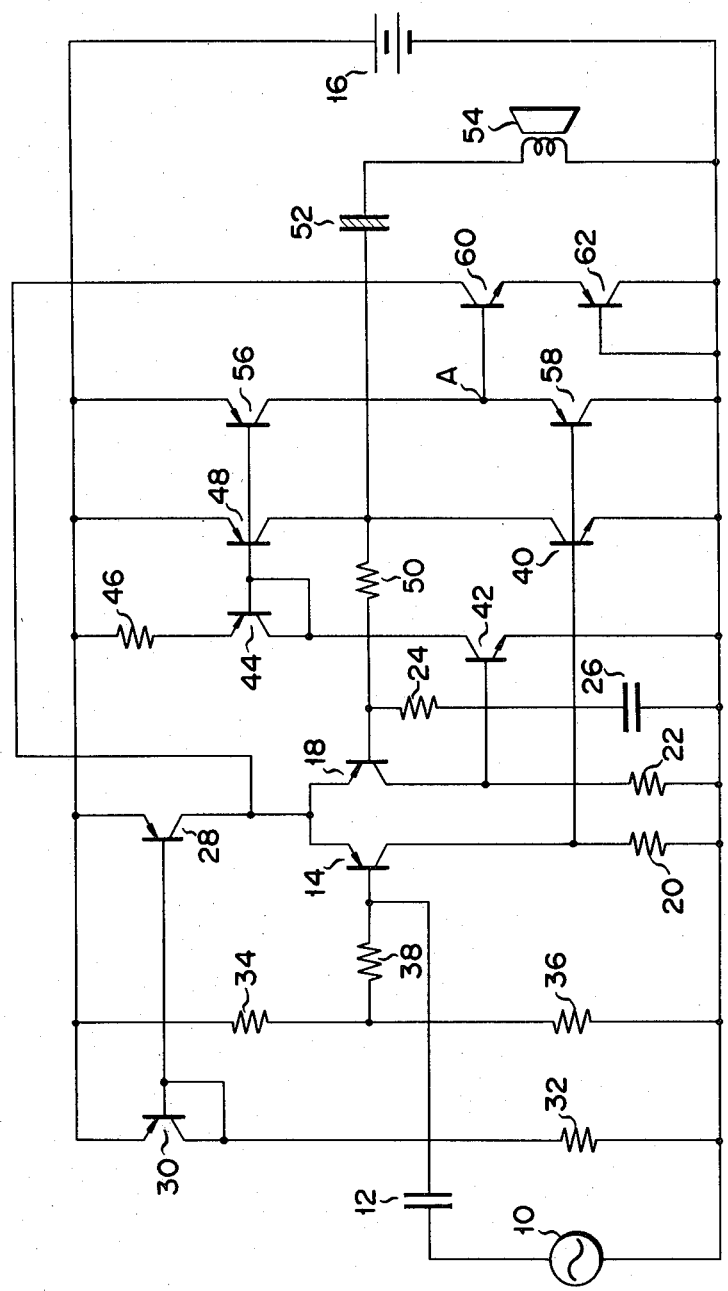

A power-amplifying circuit according to a first embodiment of this invention is now described with reference to FIG. 1 showing the circuit arrangement. One of the output terminals of a generator 10 of a signal whose power is to be amplified (hereinafter referred to as "an input signal") is connected to the base of a PNP type transistor 14 through a capacitor 12. The other output terminal of the signal generator 10 is connected to the negative terminal of a D.C. power source 16. The emitter of the transistor 14 is connected to the emitter of a PNP type transistor 18. Both PNP type transistors 14 and 18 jointly constitute a differential amplifier. The collectors of the PNP type transistors 14 and 18 are connected to the negative terminal of the D.C. power source 16 through the corresponding resistors 20 and 22. The base of the PNP transistor 18 is connected to the negative terminal of the D.C. power source 16 through a resistor 24 and capacitor 26. The emitters of the transistors 14 and 18, which are commonly connected, are connected to the collector of a PNP type transistor 28, whose emitter is connected to the positive terminal of the D.C. power source 16, and whose base is connected to the base of a PNP type transistor 30. The transistor 30 acts as a diode with the base and collector short-circuited. The collector of the transistor 30 is connected to the negative terminal of the D.C. power source 16 through a resistor 32. The emitter of the transistor 30 is connected to the positive terminal of the D.C. power source 16 and also to the negative terminal thereof through resistors 34 and 36. The junction of the resistors 34 and 36 is connected to the base of the transistor 14 through a resistor 38. The above-mentioned circuit arrangement constitutes a pre-amplifier stage.

The collectors of the transistors 14 and 18, which jointly constitute a differential amplifier, are also respectively connected to the bases of NPN type transistors 40 and 42. The emitters of the transistors 42 and 40 are connected to the negative terminal of the D.C. power source 16. The collector of the transistor 42 is connected to the collector of a PNP type transistor 44 acting as a diode with the base and collector short-circuited. The emitter of the transistor 44 is connected to the positive terminal of the D.C. power source 16 through a resistor 46. The base of the transistor 44 is connected to the base of a PNP type transistor 48. The transistors 42 and 44 and resistor 46 jointly constitute a drive stage for the transistor 48.

The emitter of the PNP type transistor 48 is connected to the positive terminal of the D.C. power source 16. The collector of the transistor 48 is connected to the collector of the transistor 40, and through a resistor 50 to the base of the transistor 18 which constitutes a differential amplifier jointly with the transistor 14. The collector of the transistor 48 is also connected through an electrolytic capacitor 52 to one end of a speaker 54 acting as a load. The other end of the speaker 54 is connected to the negative terminal of the D.C. power source 16. With the above-mentioned first embodiment, the output stage of the power-amplifying circuit is constituted by the complementary pair of the emitter-grounded NPN transistor 40 and the PNP transistor 48. The bases of these transistors 40 and 48 are respectively connected to the base of PNP type transistors 58 and 56. The emitter of the transistor 56 is connected to the positive terminal of the D.C. power source 16. The collector of the transistor 56 is connected to the emitter of the transistor 58 and also to the base of an NPN transistor 60. The PNP type transistors 48 and 56 jointly constitute a current mirror circuit. The collector of the transistor 58 is connected to the negative terminal of the D.C. power source 16. The transistors 56 and 58 jointly constitute a detect stage. The collector of the transistor 60 is connected to the emitters of the transistors 14 and 18 jointly constituting a differential amplifier. The emitter of the transistor 60 is connected to the emitter of a PNP type transistor 62, which acts as a diode with the base and collector short-circuited and whose collector is connected to the negative terminal of the D.C. power source 16. The transistors 60 and 62 jointly constitute feedback stage which generates a current which is supplied to the pre-amplifier stage through a negative feedback path.

Description is now given of the operation of a power-amplifying circuit according to a first embodiment of this invention which is arranged as described above. Now let it be assumed that the input signal generator 10 issues sine wave signals formed of alternately recurring positive and negative half cycles, as viewed from the ground potential. Then, the sine wave signals are supplied to the base of the transistor 14. As previously described, the transistors 14 and 18 jointly constitute a differential amplifier. Where, therefore, the input signal generator 10 produces a negative signal component, then a signal corresponding to the negative signal component is generated from the collector of the transistor 14 in the amplified form. Where the input signal generator 10 issues a positive signal component, then a signal corresponding to the positive signal component is produced from the collector of the transistor 18 in the amplified form. The collector current of the transistor 18 sets the transistor 48 into an operative state through the transistors 42 and 44. The collector current of the transistor 14 sets the transistor 40 into an operative state.

Therefore, sine wave signals corresponding to the positive and negative signal components are generated in the amplified form from the collectors of the transistors 48 and 40 respectively. The speaker 54 is driven by the amplified sine wave signals. That portion of the collector outputs of the transistors 48 and 40 which corresponds to the D.C. voltage and part of the A.C. voltage is supplied to the base of the transistor 18 through a negative feedback path having the resistor 50. Now let it be assumed that the resistors 34 and 36 have the same resistance, and the base of the transistor 14 has a voltage $V_{cc}/2$ ($V_{cc}$ denotes the voltage of the D.C. power source 16). Then the feedback D.C. voltage to the base of the transistor 18 also has a voltage of approximately $V_{cc}/2$.

Since the transistors 48 and 56 jointly constitute a current mirror circuit, the collector current of the transistor 48 disposed in the output stage is detected by the transistor 56. The transistor 58 is set into an operative state by the collector current of the transistor 56. The transistor 60 of the feedback stage is also set into an operative state by the collector current of the transistor 56. An operation current running through the transistors 60 and 62 is supplied to the emitters of the transistors 14 and 18 jointly constituting a differential amplifier through a negative feedback path. Now let it be assumed that the areas of the emitters of the transistors 48 and 56 have the ratio of N:1, and the operating current of the transistor 48, that is a current flowing through the transistor 48, is expressed as $I_U$. Then the operating current $I_{56}$ of the transistor 56 may be expressed as follows:

$$I_{56} = I_U/N$$

The base potential of the transistor 60 at point A shown in FIG. 1 may be expressed as a sum of the base-emitter voltage $V_{BE\,40}$ of the transistor 40 and the base-emitter voltage $V_{BE\,58}$ of the transistor 58 or a sum of the base-emitter voltage $V_{BE\,60}$ of the transistor 60 and the base-emitter voltage $V_{BE\,62}$ of the transistor 62. Now let it be assumed that the emitter areas of the transistors 40 and 60 have a ratio of M:1, the operating current of the transistor 40 is $I_L$, and any NPN type transistor used in the power-amplifying circuit of this invention has a reverse saturation current $I_{SN}$. Then the base-emitter voltage $V_{BE\,40}$ of the NPN type transistor 40 may be expressed as follows:

$$V_{BE\,40} = \frac{KT}{q} \ln \frac{I_L}{MI_{SN}} \qquad (1)$$

where:
K = Boltzmann constant
T = absolute temperature
q = charge of an electron With $I_{SP}$ taken to represent the reverse saturation current of any PNP type transistor used in the power-amplifying circuit of this invention and $I_U$, then the base-emitter voltage $V_{BE\,58}$ of the PNP type transistor 58 may be expressed as follows:

$$V_{BE\,58} = \frac{KT}{q} \ln \frac{I_U}{NI_{SP}} \qquad (2)$$

Accordingly, a potential at point A (that is, a sum of $V_{BE\,40}$ and $V_{BE\,58}$) may be expressed as follows from the above equations (1) and (2):

$$V_{BE\,40} + V_{BE\,58} = \frac{KT}{q} \ln \frac{I_L}{MI_{SN}} + \frac{KT}{q} \ln \frac{I_U}{NI_{SP}} \qquad (3)$$

With $I_F$ taken to denote a current running through the NPN type transistor 60 and PNP type transistor 62 (that is, an operating current supplied to the pre-amplifier through a negative feedback path), the base-emitter voltages $V_{BE\,60}$, $V_{BE\,62}$ of the transistors 60 and 62 may be respectively expressed as follows:

$$V_{BE\,60} = \frac{KT}{q} \ln \frac{I_F}{I_{SN}} \qquad (4)$$

$$V_{BE\,62} = \frac{KT}{q} \ln \frac{I_F}{I_{SP}} \qquad (5)$$

Therefore, a potential at point A may be rewritten as follows from the above equations (4) and (5):

$$V_{BE\,60} + V_{BE\,62} = \frac{KT}{q} \ln \frac{I_F}{I_{SN}} + \frac{KT}{q} \ln \frac{I_F}{I_{SP}} \quad (6)$$

The following relationship is derived from the above equations (3) and (6):

$$\ln \frac{I_L}{MI_{SN}} + \ln \frac{I_U}{NI_{SP}} = \ln \frac{I_F}{I_{SN}} + \ln \frac{I_F}{I_{SP}} \quad (7)$$

$$I_L I_U = MN I_F^2$$

$$\therefore I_F = \sqrt{I_L I_U / MN} \propto \sqrt{I_L I_U}$$

The current $I_F$ which is supplied to the collector of the transistor 28 through a negative feedback path may be expressed as follows:

$$I_F = \frac{V_{cc} - V_{BE\,30}}{R_{32}} - \frac{V_{BE\,40}}{R_{20}} - \frac{V_{BE\,42}}{R_{22}} \quad (8)$$

where:
 $V_{BE\,30}$=base-emitter voltage of the transistor 30
 $V_{BE\,42}$=base-emitter voltage of the transistor 42
 $R_{32}$, $R_{20}$ and $R_{22}$=resistances of the respective resistors 32, 20 and 22

Since the operating current $I_F$ is substantially regulated after the above-mentioned feedback, a product $I_U \times I_L$ of the operating currents of the transistors 48 and 40 is also substantially regulated. Where, therefore, an input signal of a positive component is supplied, and the operating current $I_U$ of the transistor 48 is increased, then the operating current $I_L$ of the transistor 40 is decreased. Conversely where an input signal of a negative component is supplied, and the operating current $I_L$ of the transistor 40 increased, then the operating current $I_U$ of the transistor 48 is decreased. Eventually, the output stage carries out a class-AB push-pull operation. Further, where no input signal is supplied, then there results $$I_L \doteq I_U$$

Therefore, the quiescent current $I_{idle}$ of the transistors 40 and 48 in the output stage can be easily defined as follows, thereby reducing the occurrence of crossover distortions.

$$I_{idle} = \sqrt{MN I_F} \quad (9)$$

FIG. 2 graphically indicates the characteristics of the operating currents of the transistors 40 and 48. The abscissa denotes the amplitude of input signal. The ordinate indicates the values of the corresponding operating currents $I_L$ and $I_U$. A broken line denotes the values of the quiescent current $I_{idle}$ of the transistors 40 and 48. According to the first embodiment of this invention, the operating current $I_U$ of the output transistor 48 which constitutes a push-pull circuit jointly with the output transistor 40 is detected by the transistor 56. A sum of the base-emitter voltage of the transistor 58 which is set into an operative state by the detected operating current $I_U$, and whose base is connected to the base of the transistor 40 and the base-emitter voltage of the transistor 40 is made equal to a sum of the base-emitter voltages of the transistors 60 and 62 jointly constituting a feedback stage. Consequently, a product of the operating currents of the output transistors 48 and 40 can be substantially regulated, thereby providing a power-amplifying circuit of simple circuit arrangement whose output characteristic during the fall of a power source voltage is improved and which can carry out a stable class-AB operation even by a low power source voltage.

Figure 3:
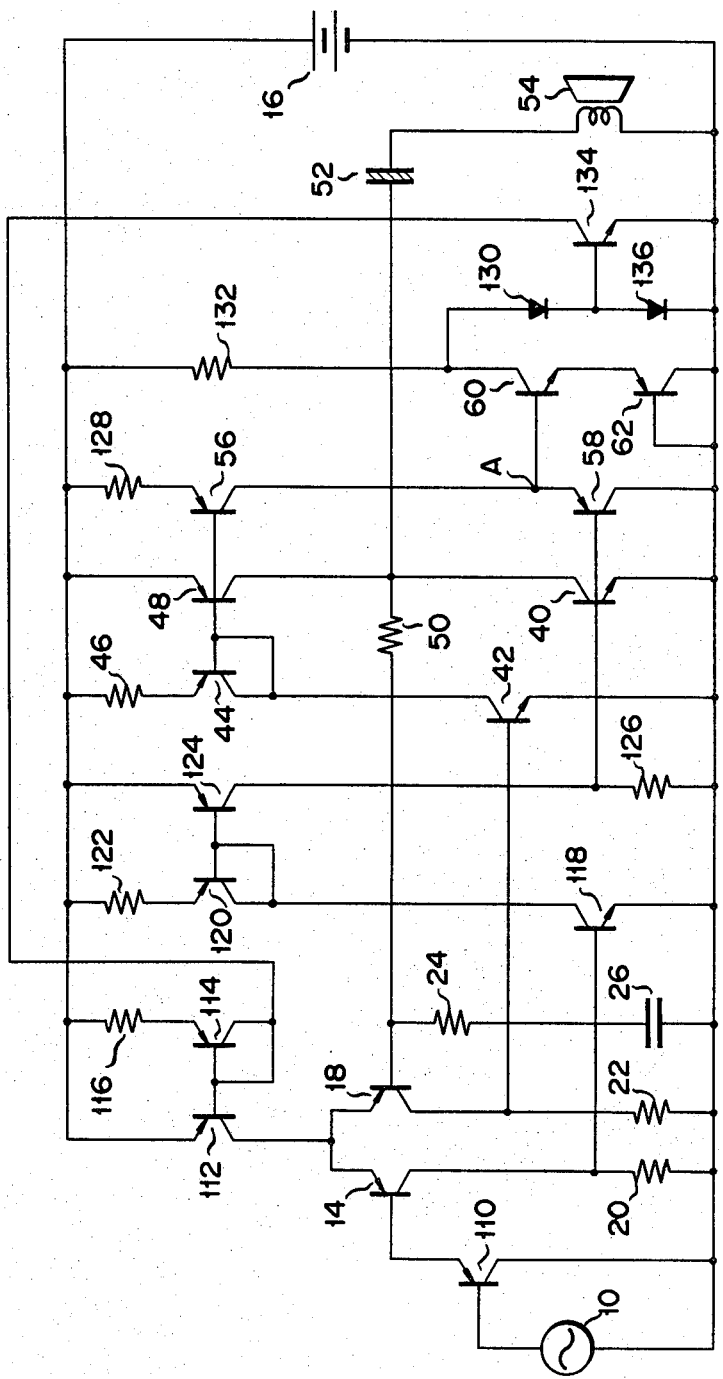

A power-amplifying circuit according to a second embodiment of this invention is now described with reference to FIG. 3. The parts of the other embodiments the same as those of FIG. 1 are denoted by the same numerals. One of the output terminals of an input signal generator 10 is connected to the base of a PNP type transistor 110. The collector of the transistor 110 and the other output terminal of the input signal generator 10 are connected to the negative terminal of a D.C. power source 16. The emitter of the transistor 110 is connected to the base of a PNP type transistor 14, whose collector is connected to the negative terminal of the D.C. power source 16 through a resistor 20 and whose emitter is connected to the emitter of a PNP type transistor 18. Both PNP type transistors 14, 18 jointly constitute a differential amplifier. The collector of the transistor 18 is connected to the negative terminal of the D.C. power source 16 through a resistor 22. The base of the transistor 18 is connected to the negative terminal of the D.C. power source 16 through a resistor 24 and capacitor 26. The emitters of the transistors 14 and 18, which are commonly connected, are connected to the collector of a PNP type transistor 112, whose base is connected to the base of a PNP type transistor 114 which acts as a diode with the base and collector short-circuited. The emitter of the transistor 112 is directly connected to the positive terminal of the D.C. power source 16. The emitter of the transistor 114 is connected to the positive terminal of the D.C. power source 16 through a resistor 116. The above-mentioned circuit section constitutes a pre-amplifier stage.

The collectors of the transistors 14 and 18 jointly constituting a differential amplifier are respectively connected to the bases of NPN type transistors 118 and 42. The emitter of the transistor 118 is connected to the negative terminal of the D.C. power source 16. The collector of the transistor 118 is connected to the collector of a PNP transistor 120 which acts as a diode with the base and emitter short-circuited. The emitter of the transistor 120 is connected to the positive terminal of the D.C. power source 16 through a resistor 122. The base of the transistor 120 is connected to the base of a PNP type transistor 124, whose emitter is connected to the positive terminal of the D.C. power source 16, and whose collector is connected to the base of an NPN type transistor 40, and also to the negative terminal of the D.C. power source 16 through resistor 126. The emitter of a transistor 42 is connected to the negative terminal of the D.C. power source 16, and the collector of the transistor 42 is connected to the collector of a PNP type transistor 44 which acts as a diode with the base and collector short-circuited. The emitter of the transistor 44 is connected to the positive terminal of the D.C. power source 16 through a resistor 46. The base of the transistor 44 is connected to the base of a PNP type transistor 48. The above-mentioned transistors 118, 120, 124, 42 and 44 and resistors 122, 126 and 46 jointly constitute a common drive stage to the transistors 48 and 40.

The emitter of the transistor 48 is connected to the positive terminal of the D.C. power source 16. The collector of the transistor 48 is connected to the collector of the transistor 40, and also to the base of the transistor 18 through a resistor 50. Further, the collector of the transistor 48 is connected to the negative terminal of the D.C. power source 16 through an electrolytic capacitor 52 and speaker 54. The emitter of the transistor 40 is connected to the negative terminal of the D.C. power source 16. With the second embodiment, too, the output stage is formed of the complementary pair of the PNP transistor 48 and the emitter-grounded NPN transistor 40. The bases of the transistors 48 and 40 are respectively connected to the bases of PNP transistors 56 and 58. The emitter of the transistor 56 is connected to the positive terminal of the D.C. power source 16 through a resistor 128. The collector of the transistor 56 is connected to the emitter of the transistor 58 and the base of an NPN type transistor 60. The transistor 56 and output transistor 48 jointly constitute a current mirror circuit. The collector of the transistor 58 is connected to the negative terminal of the D.C. power source 16. The collector of the transistor 60 is connected to the anode of a diode 130, and also to the positive terminal of the D.C. power source 16 through a resistor 132. The emitter of the transistor 60 is connected to the emitter of a PNP type transistor 62, whose base and collector are short-circuited and whose collector is connected to the negative terminal of the D.C. power source 16. The cathode of a diode 130 is connected to the base of an NPN type transistor 134 and the anode of a diode 136. The collector of the transistor 134 is connected to the bases of transistors 112 and 114 included in the pre-amplifier stage. The emitter of the transistor 134 and the cathode of the diode 136 are connected to the negative terminal of the D.C. power source 16. The transistors 60, 62 and 134 and diodes 130 and 136, and resistor 132 jointly constitute a feedback stage.

The operation of a power-amplifying circuit according to a second embodiment of this invention which is arranged as described above is now described with reference to FIGS. 4A to 4D illustrating the waveforms of signals. Throughout FIGS. 4A to 4D, the abscissa denotes time T. A sine wave input signal I (FIG. 4A) whose power is to be amplified is produced by the input signal generator 10, and supplied to the base of the transistor 14. The transistors 14, 18 jointly constitutes a differential amplifier. Where, therefore, the input signal I has positive and negative components, as shown in FIGS. 4B and 4C, the amplified sine wave signals corresponding to the positive and negative components are produced from the collectors of the transistors 18 and 14, respectively. The collector current $I_{18}$ of the transistor 18 sets the transistor 48 into an operative state through the transistors 42 and 44. The collector current $I_{14}$ of the transistor 14 sets the transistor 40 into an operative state through the transistors 118, 120 and 124. Where, therefore, an input signal of a positive component is supplied, the collector of the transistor 48 of the output stage is supplied with an amplified sine wave signal corresponding to the input signal. Where the input signal of a negative component is supplied, the collector of the transistor 40 of the output stage is supplied with an amplified sine wave signal corresponding to the input signal. These amplified sine wave signals drive the speaker 54. In other words, the output state carries out the push-pull operation. That portion of the outputs from the collectors of the transistors 48 and 40 which corresponds to the D.C. voltage and part of the A.C. voltage is supplied to the base of the transistor 18 through the negative feedback path having the resistor 50.

The base current of the output transistor 48 is supplied to the base of the detection transistor 56. The transistor 58 is set into an operative state in proportion to the amplitude of the collector current of the transistor 56.

Now let it be assumed that an operating current running through the transistors 60 and 62 is expressed as $I_{F1}$, the operating current of the transistor 40 is denoted by $I_L$, the emitter areas of the transistors 48 and 56 have a ratio of N:1, and the emitter areas of the transistors 40 and 60 have a ratio of M:1. Then, as in the first embodiment, the following equation results with respect to a potential at point A of FIG. 3:

$$I_{F1} = \sqrt{I_L I_U/MN} \propto \sqrt{I_L I_U} \tag{10}$$

Assuming that a substantially constant current $I_0$ runs through a resistor 132, the collector current of the transistor 134, namely, a signal $I_{F2}$ which is to be supplied to the pre-amplifier stage through the negative feedback path is expressed as follows:

$$I_{F2} = I_0 - I_{F1} = I_0 - \sqrt{I_L I_U/MN} \tag{11}$$

FIG. 4D shows the waveform of the feedback current $I_{F2}$. The transistors 112 and 114 jointly constitute a current mirror circuit. The feedback current $I_{F2}$ is supplied in such a manner that where the feedback current $I_{F2}$ increases (at this time the operating current $I_{F1}$ of the transistor 60 decreases), then the bias currents of the differential amplifier transistors 14 and 18 increase, so that the operating currents of the output transistors 48 and 40 increase. As a result, a product of the operating currents of the output transistors 48 and 40 is regulated, causing the output stage to carry out a class-AB push-pull operation. With the first embodiment, the above-mentioned feedback was carried out so as to decrease the bias current of the differential amplifier. Therefore, a feedback current $I_F$ capable of driving the output transistors 48 and 40 with a sufficient surplus was supplied from the transistor 28 to the transistor 60. Where, with the first embodiment, an input signal had a small amplitude, then only part of the feedback current $I_F$ was utilized, causing most of the feedback current $I_F$ to be wasted. With the second embodiment, however, the pre-amplifier and drive stages are normally driven by a very small current. The bias currents of these stages are increased in accordance with the amplitude of an input signal. Therefore, waste of the feedback current decreases, thereby more efficiently utilizing a power source, and rendering a power-amplifying circuit more adapted to be driven by a low power source voltage. The resistor 132 may be replaced by a constant current circuit.

Figure 5:
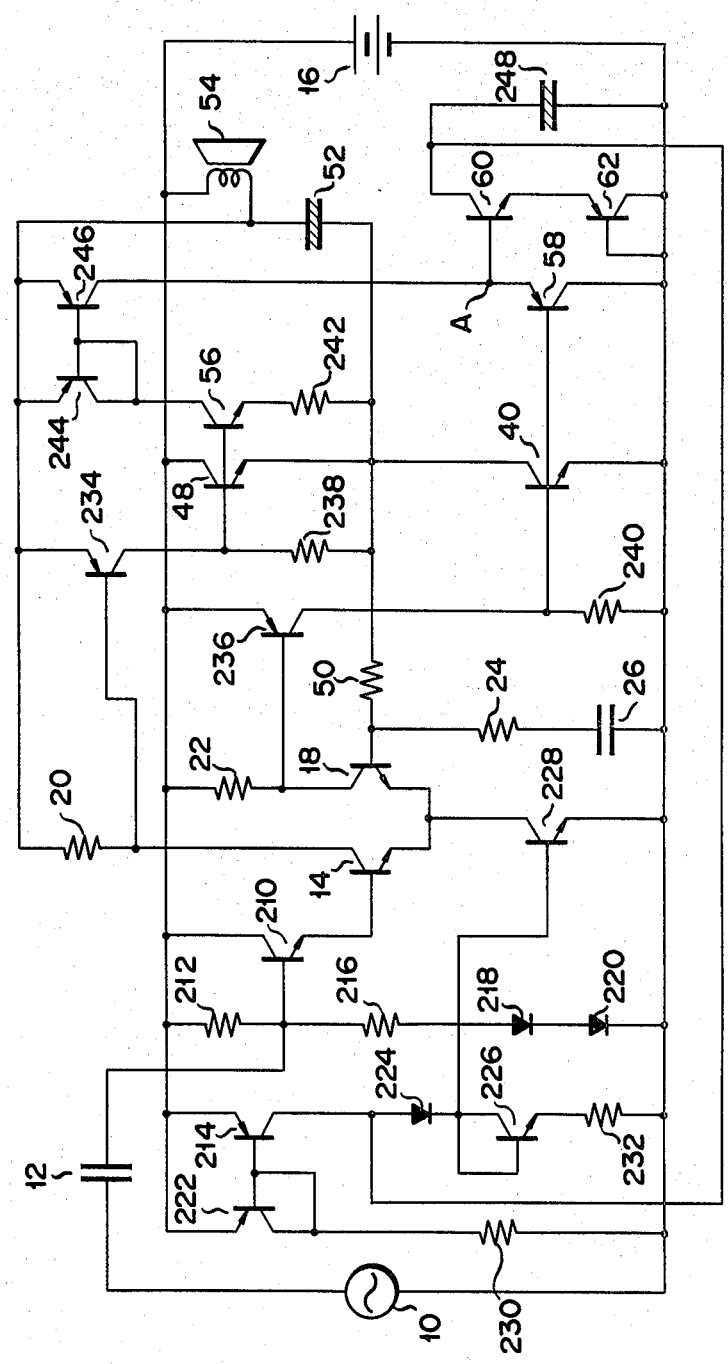
FIG. 5 shows the arrangement of a power-amplifying circuit according to a third embodiment of the invention.

A power-amplifying circuit according to a third embodiment of this invention is now described with reference to FIG. 5. One of the output terminals of an input signal generator 10 is connected to the base of an NPN type transistor 210 through a capacitor 12. The other output terminal of the input signal generator 10 is connected to the negative terminal of a D.C. power source 16. The base of the transistor 210 is connected through a resistor 212 to the emitter of a PNP type transistor 214 and to the positive terminal of the D.C. power source 16. The base of the transistor 210 is also connected to the anode of a diode 218 through a resistor 216. The cathode of the diode 218 is connected to the anode of a diode 222 whose cathode is connected to the negative terminal of the D.C. power source 16. The emitter and base of the transistor 214 are respectively connected to the emitter and base of a PNP transistor 222 which acts as a diode with the base and collector short-circuited. The collector of the transistor 214 is connected to the anode of a diode 224, and the cathode of the diode 224 is connected to the collector of an NPN type transistor 226 which acts as a diode with the base and collector short-circuited and also to the base of an NPN type transistor 228. The collector of the transistor 222 is connected to the negative terminal of the D.C. power source 16 through a resistor 230. The emitter of the transistor 226 is connected to the negative terminal of the D.C. power source 16 through a resistor 232. The emitter of the transistor 228 is directly connected to the negative terminal of the D.C. power source 16. The collector of the transistor 210 is connected to the positive terminal of the D.C. power source 16. The emitter of the transistor 210 is connected to the base of an NPN type transistor 14, whose emitter is connected to the collector of a transistor 228 and the emitter of the NPN type transistor 18. The transistors 14 and 18 jointly constitute a differential amplifier. The collector of the transistor 14 is connected to the positive terminal of the D.C. power source 16 through a resistor 20 and speaker 54. The collector of the transistor 18 is connected to the positive terminal of the D.C. power source 16 through a resistor 22. The base of the transistor 18 is connected to the negative terminal of the D.C. power source 16 through a resistor 24 and capacitor 26. The above-mentioned elements jointly constitute a pre-amplifier stage.

The collectors of the transistors 14 and 18 are respectively connected to the bases of PNP type transistors 234 and 236 jointly constituting a drive stage. The collector of the transistor 234 is connected to the base of an NPN type output transistor 48 and also to the emitter thereof through a resistor 238. The collector of the transistor 236 is connected to the base of an NPN type output transistor 40, and also to the emitter of the transistor 40 through a resistor 240. With the third embodiment of FIG. 5, the output stage is formed of NPN type transistors of the same polarity. The collector of the transistor 48 is connected to the positive terminal of the D.C. power source 16. The emitter of the transistor 48 is connected to the collector of the transistor 40, the base of the transistor 18 through a resistor 50 and also to the speaker 54 through an electrolytic capacitor 52. The emitter of the transistor 40 is connected to the negative terminal of the D.C. power source 16. The bases of the transistors 48 and 40 are respectively connected to the base of an NPN type transistor 56, and the base of a PNP type transistor 58. The emitter of the transistor 56 is connected to the speaker 54 through a resistor 242 and capacitor 52. The collector of the transistor 56 is connected to the collector of a PNP type transistor 244 which acts as a diode with the base and emitter short-circuited and also to the base of a PNP type transistor 246. The emitters of the transistors 234, 244 and 246 are connected to the speaker 54. The collector of the transistor 246 is connected to the emitter of the transistor 58 and the base of an NPN transistor 60, whose collector is connected to the anode of the diode 224 included in the pre-amplifier stage and also to the negative terminal of the D.C. power source 16 through a capacitor 248. The emitter of the transistor 60 is connected to the emitter of the PNP type transistor 62 which acts as a diode with the base and collector short-circuited. The collectors of the transistors 58 and 62 are connected to the negative terminal of the D.C. power source 16.

With the third embodiment, as well as with the first embodiment, where a positive signal component of the sine wave is generated from the input signal generator 10, then the collector of the transistor 18 is supplied with a signal corresponding to the input signal in the amplified form. Where a negative signal component of the sine wave is generated from the input signal generator 10, then the collector of the transistor 14 is supplied with a signal corresponding to the input signal in the amplified form. Where a positive signal component of the sine wave is generated from the input signal generator 10, then the transistor 40 of the output stage generates an output signal upon receipt of an output from the collector of the transistor 18. Where a negative signal component of the sine wave is generated from the input signal generator 10, then the transistor 48 of the output stage sends forth an output signal upon receipt of an output from the collector of the transistor 14. The issue of the output signals is referred to as a class-AB push-pull operation. Outputs from the collectors of the transistors 48 and 40 drive the speaker 54. The operating current of the output transistor 48 detected by the detection transistor 56 is conducted through a current mirror circuit constituted by the transistors 244 and 246 to be the operating current of the transistor 58.

Referring to a potential at point A indicated in FIG. 5, an operating current $I_{F3}$ flowing through the transistors 60 and 62 is expressed as follows in the form of a product of the operating currents of the transistors 48 and 40 as in the first embodiment:

$$I_{F3} \propto \sqrt{I_U I_L}$$

The operating current $I_{F3}$ is supplied to the anode of the diode 224 of the pre-amplifier stage through a negative feedback path. The transistors 222 and 214 jointly constitute a source of a constant current. A collector current of the transistor 214 is also supplied to the anode of the diode 224. A current corresponding to a difference between the current $I_{F3}$ and the collector current of the transistor 214 is supplied to the cathode of the diode 224. The differential current is supplied to the emitters of the transistors 14 and 18 jointly constituting a differential amplifier through a current mirror circuit consisting of the transistor 226, resistor 232, and transistor 228 and having a gain. Where, therefore, a feedback current decreases (that is, the operating current of the output transistor decreases), then the bias current of the differential amplifier increases as in the second embodiment, thereby more efficiently utilizing a power source. With the third embodiment, a capacitor 248 is connected to the collector of the transistor 60 of the feedback stage, thereby preventing the transistors 14 and 18 jointly constituting the differential amplifier of the pre-amplifier stage from making oscillations when the feedback loop has a large gain. Further, since it is possible to let the feedback loop have a large gain, variations in the quiescent current can be suppressed. The capacitor 52 is of the bootstrap type.

Figure 6:
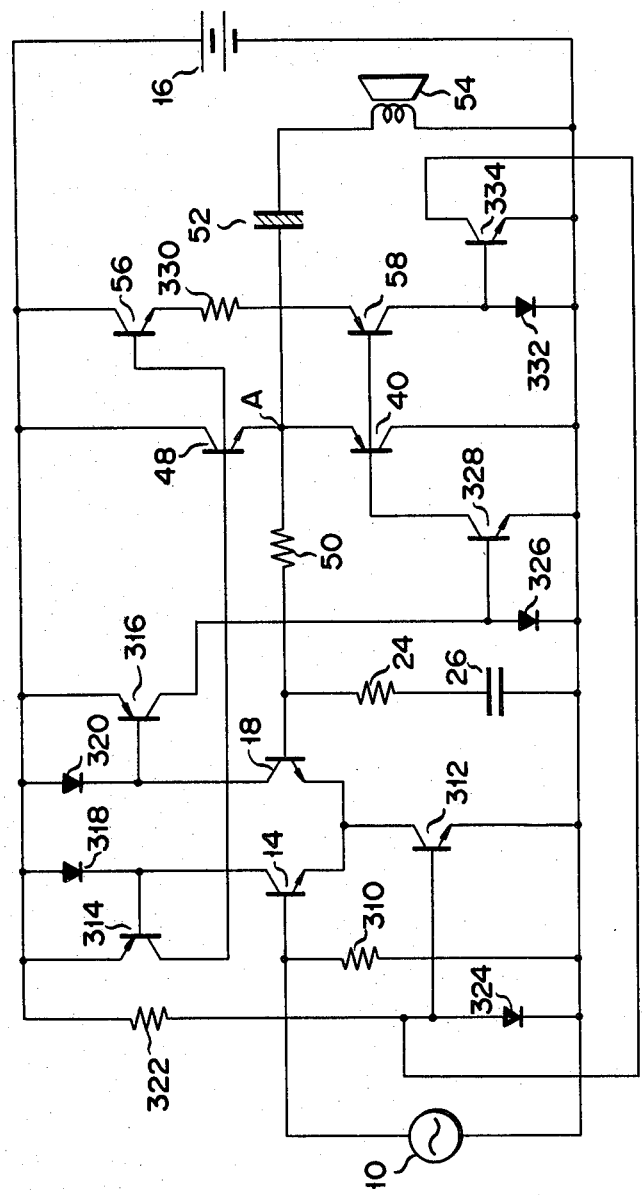
FIG. 6 indicates the arrangement of a power-amplifying circuit according to a fourth embodiment of the invention.

A power-amplifying circuit according to a fourth embodiment of this invention is now described with reference to FIG. 6. One of the output terminals of an input signal generator 10 is connected to the base of an NPN type transistor 14. The other output terminal of the input signal generator 10 is connected to the negative terminal of a D.C. power source 16. The base of the transistor 14 is connected to the negative terminal of the D.C. power source 16 through a resistor 310. The emitter of the transistor 14 is connected to the emitter of an NPN type transistor 18 and also to the collector of an NPN type transistor 312. The transistors 14 and 18 jointly constitute a differential amplifier. The collectors of the transistors 14 and 18 are respectively connected to the bases of PNP type transistors 314, 316, and also to the cathodes of diodes 318 and 320. The anodes of the diodes 318 and 320 are connected to the positive terminal of the D.C. power source 16. The base of the transistor 18 is connected to the negative terminal of the D.C. power source 16 through a resistor 24 and capacitor 26. The emitter of a transistor 314 is connected to the positive terminal of the D.C. power source 16, and through a resistor 322 to the anode of a diode 324 and the base of the transistor 312. The collector of the transistor 314 is connected to the base of an NPN type transistor 48. The cathode of the diode 324 and the emitter of the transistor 312 are connected to the negative terminal of the D.C. power source 16. The emitter of the transistor 316 is connected to the positive terminal of the D.C. power source 16. The collector of the transistor 316 is connected to the anode of a diode 326 and the base of an NPN type transistor 328. The cathode of the diode 326 and the emitter of the transistor 328 are connected to the negative terminal of the D.C. power source 16. The collector of the transistor 328 is connected to the base of a PNP type transistor 40, whose emitter is connected to the emitter of a transistor 48, and through a resistor 50 to the base of the transistor 18, and further through an electrolytic capacitor 52 to a speaker 54. Complementary pair of transistors 48 and 40 jointly constitute an output stage. The collectors of the transistors 48 and 40 are respectively connected to the positive and negative terminals of the D.C. power source 16. The bases of the transistors 48 and 40 are respectively connected to the base of an NPN type transistor 56 and the base of a PNP type transistor 58. The collector of the transistor 56 is connected to the positive terminal of the D.C. power source 16. The emitter of the transistor 56 is connected to the emitter of the transistor 58 through a resistor 330. The collector of the transistor 58 is connected to the anode of a diode 332 and the base of an NPN type transistor 334. The cathode of the diode 332 and the emitter of the transistor 334 are connected to the negative terminal of the D.C. power source 16. The collector of the transistor 334 is connected to the anode of the diode 324.

With the above-mentioned fourth embodiment, the output stage comprises emitter follower transistors. In this case, too, the output transistors 48 and 40 carry out a class-AB push-pull operation upon receipt of an output from the differential amplifier formed of the transistors 14 and 18. The operating currents of the output transistors 48 and 40 which are supplied to the differential amplifier from the collector of the transistor 334 through a negative feedback path are substantially regulated.

What we claim is:
1. A power-amplifying circuit comprising:
   a pre-amplifier stage;
   an output stage having first and second transistors in a push-pull arrangement and adapted to be driven by said pre-amplifier stage, said first transistor having its emitter grounded;
   current detection means, having a third transistor with its base-to-emitter path connected in parallel with the base-to-emitter path of said second transistor, for detecting electric current flow through said second transistor;
   converting means, having a fourth transistor having its base connected to the base of said first transistor and having its emitter connected to an output terminal of said current detection means, for converting an output current of said current detection means to a voltage;
   a feedback path; and
   operation means connected to said converting means, having fifth and sixth transistors connected such that the sum of the base-to-emitter voltage of said first transistor and an output voltage of said converting means is equal to the sum of the base-to-emitter voltages of said fifth and sixth transistors, for supplying an electric current corresponding to a product of operating currents flowing through said first and second transistors to said pre-amplifier stage through said feedback path.

2. A power-amplifying circuit according to claim 1 in which said fourth transistor of said converting means is a PNP type transistor having its emitter connected to the collector of said third transistor and its collector grounded; said fifth transistor of said operations means is of an NPN type having its base connected to the emitter of said fourth transistor and its collector connected to the feedback path; and said sixth transistor is of an PNP type having its emitter connected to the emitter of said fifth transistor and its base and collector grounded.

3. The power-amplifying circuit according to claim 2, wherein said operation means includes a constant current generator, and supplies a current corresponding to a difference between a current produced by the constant current generator and a current flowing through said fifth and sixth transistors to said preamplifier means.

4. The power-amplifying circuit according to claim 2, in which said first and second transistors are NPN type transistors, said operation means further includes a capacitor connected in parallel to said fifth and sixth transistors and a constant current generator, and supplies a current corresponding to a difference between a current produced by the constant current generator and a current flowing through said fifth and sixth transistors to said pre-amplifier means.

5. A power-amplifying circuit comprising:
   a pre-amplifying stage;
   an output stage having first and second transistors in a push-pull arrangement which have their emitters connected to each other, and said first and second transistors are connected to be driven by said pre-amplifier stage;
   a feedback path; and
   operation means, having third and fourth transistors having their base-to-emitter paths connected in series with each other and said series coupled at one end to the base of said first transistor and at the other end to the base of said second transistor for supplying an electric current, corresponding to a product of operating currents flowing through said first and second transistors, to the pre-amplifying stage through said feedback path.

6. A power-amplifying circuit according to claim 5, in which said first transistor of said output stage and said third transistor of said operation means are PNP transistors having their collectors grounded, and said second and fourth transistors are NPN transistors.

* * * * *